US008636381B2

(12) United States Patent
Huang et al.

(10) Patent No.: US 8,636,381 B2
(45) Date of Patent: Jan. 28, 2014

(54) FLEXIBLE LIGHT SOURCE MODULE

(75) Inventors: Chen-Yang Huang, Hsinchu County (TW); Tsai-Lin Tai, Kaohsiung (TW); Chao-Kai Hsu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 514 days.

(21) Appl. No.: 12/981,495

(22) Filed: Dec. 30, 2010

(65) Prior Publication Data
US 2012/0140464 A1  Jun. 7, 2012

(30) Foreign Application Priority Data
Dec. 7, 2010 (TW) .............................. 99142586 A

(51) Int. Cl.
    *F21S 4/00* (2006.01)
(52) U.S. Cl.
    USPC ....... 362/249.04; 362/235; 362/236; 362/237
(58) Field of Classification Search
    USPC .................................... 362/249.04, 235–237
    See application file for complete search history.

(56) References Cited

U.S. PATENT DOCUMENTS

| 7,513,632 | B2 | 4/2009 | Kim et al. |
| 7,540,635 | B2 | 6/2009 | Kim et al. |
| 7,543,965 | B2 | 6/2009 | Noh et al. |
| 7,547,923 | B2 | 6/2009 | Shin et al. |
| 7,549,769 | B2 | 6/2009 | Kim et al. |
| 7,572,026 | B2 | 8/2009 | Park |
| 7,591,568 | B2 | 9/2009 | Park et al. |
| 7,602,559 | B2 | 10/2009 | Jang et al. |
| 7,649,593 | B2 | 1/2010 | Yoon et al. |
| 7,658,515 | B2 | 2/2010 | Park et al. |
| 7,675,682 | B2 | 3/2010 | Lee et al. |
| 7,746,565 | B2 | 6/2010 | Paek et al. |
| 2004/0223328 | A1* | 11/2004 | Lee et al. ................... 362/249 |

(Continued)

FOREIGN PATENT DOCUMENTS

| CN | 1591914 | 3/2005 |
| CN | 101469837 | 7/2009 |

(Continued)

OTHER PUBLICATIONS

"Office Action of Taiwan Counterpart Application", issued on Jul. 3, 2013, p. 1- p. 8.

(Continued)

*Primary Examiner* — Sean Gramling
(74) *Attorney, Agent, or Firm* — Jianq Chyun IP Office

(57) ABSTRACT

A flexible light source module including a flexible substrate, a flexible light guide film and a plurality of point light sources is provided. The flexible light guide film including light-guiding portions is disposed on the point light sources. Each of the light-guiding portions includes a light incident surface and a light emitting surface. The light incident surface includes light incident sub-surfaces. The light emitting surface includes light emitting sub-surfaces, and the one closest to the geometric center of the light-guiding portion is a first light emitting sub-surface. The absolute values of the tangent slopes of the first light emitting sub-surface are ascending with approaching the geometric center of the light-guiding portion. The light beams emitted from the point light sources exit out of the flexible light source module via the flexible light guide film so that the flexible light source module provides a uniform planar light source.

29 Claims, 8 Drawing Sheets

(56) References Cited

U.S. PATENT DOCUMENTS

| | | | |
|---|---|---|---|
| 2006/0083000 A1* | 4/2006 | Yoon et al. | 362/311 |
| 2006/0203494 A1 | 9/2006 | Ohkawa | |
| 2009/0196014 A1* | 8/2009 | Hsiao et al. | 362/84 |
| 2009/0219716 A1* | 9/2009 | Weaver et al. | 362/235 |
| 2011/0127903 A1* | 6/2011 | Yao et al. | 313/498 |

FOREIGN PATENT DOCUMENTS

| | | |
|---|---|---|
| CN | 201462499 | 5/2010 |
| CN | 101883994 | 11/2010 |
| FR | 2943613 | 10/2010 |
| JP | 2005093622 | 4/2005 |
| JP | 2009199803 | 9/2009 |
| JP | 2010161424 | 7/2010 |
| TW | 483177 | 1/2002 |
| TW | I246037 | 12/2005 |
| TW | I247175 | 1/2006 |
| TW | 200921207 | 5/2009 |
| WO | 2009157166 | 12/2009 |

OTHER PUBLICATIONS

"Office Action of China Counterpart Application", issued on Nov. 26, 2013, p. 1-p. 10.

* cited by examiner

FLEXIBLE LIGHT SOURCE MODULE

CROSS-REFERENCE TO RELATED APPLICATION

This application claims the priority benefit of Taiwan application serial no. 99142586, filed on Dec. 7, 2010. The entirety of the above-mentioned patent application is hereby incorporated by reference herein and made a part of this specification

BACKGROUND

1. Technical Field

The disclosure generally relates to a light source module, and more particularly, to a flexible light source module.

2. Description of Related Art

Along with the progress of optoelectronic technology, the light-emitting diode (LED) light source has been applied in more broad fields, such as indicator box, illumination board, backlight module and advertising lamp board. Regardless of any applications, the LED light source has caused revolutionary impact on various illuminations and display products, which overthrows the mechanical impression as currently known. The most product applications for the LED light sources are towards developing a super-slim planar light source. However, in terms of the current technology, the major bottle neck thereof rests in how to convert a point light source into a uniform planar light source in addition to eliminating the naked-eye uncomfortable feeling caused by glare. Hence, an appropriate design of light guide film holds the decisive key.

In reviewing the currently related technology, both the side-type light source module and the direct-type light source module have some shortages, for example, they have no flexibility. On the other hand, the side-type light source module, due to the limitation of light-guiding distance, encounters difficulty on the application of a large area display; while the direct-type light source module, although it can be easily used in a large dimension display, but it is difficult to get diffusion uniforming, wherein a high density LED array or a certain optical path is required so as to achieve the effect of uniform planar light source. In short, how to provide a uniform flexible light source module is definitely needed.

SUMMARY

Accordingly, the invention provides a flexible light source module, which includes a flexible substrate, a flexible light guide film and a plurality of point light sources. The flexible light guide film is disposed on the point light sources. The flexible light guide film includes a plurality of light-guiding portions. Each of the light-guiding portions includes a light incident surface and a light emitting surface, wherein the light incident surface includes a plurality of light incident sub-surfaces. Among the light incident sub-surfaces, the one closest to the geometric center of the light-guiding portion is a first light incident sub-surface. The light emitting surface is opposite to the light incident surface and includes a plurality of light emitting sub-surfaces. Among the light emitting sub-surfaces, the one closest to the geometric center of the light-guiding portion is a first light emitting sub-surface. The absolute values of the tangent slopes of the first light emitting sub-surface are ascending with approaching the geometric center of the light-guiding portion. The plural point light sources are disposed at the flexible substrate, wherein the light beams emitted from the point light sources exit out of the flexible light source module via the flexible light guide film so that the flexible light source module provides a planar light source.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain the principles of the disclosure.

DESCRIPTION OF THE EMBODIMENTS

Figure 1:
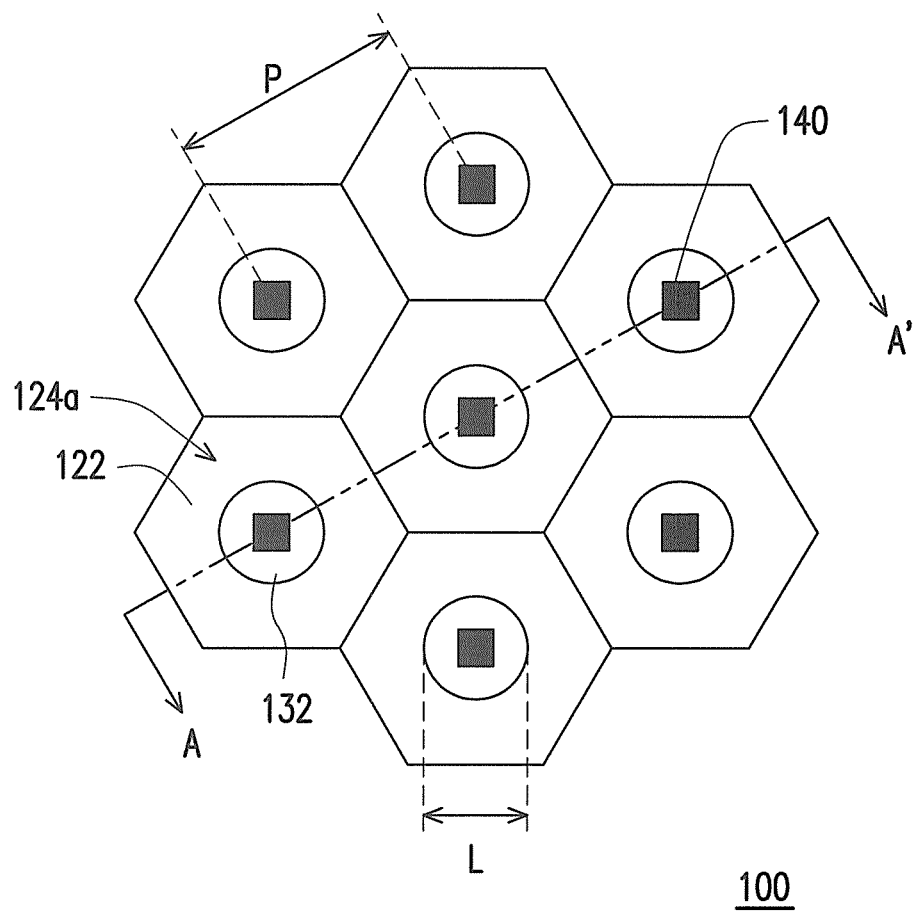
FIG. 1 is a top view diagram of a flexible light source module according to an embodiment.

Reference will now be made in detail to the preferred embodiments of the disclosure, examples of which are illustrated in the accompanying drawings. Wherever possible, the same reference numbers are used in the drawings and the description to refer to the same or like parts.

In the disclosed exemplary embodiment, a flexible light source module is, for example, a direct-type flexible planar light source module and includes a flexible light guide film with a corrugated light-guiding structure. By means of the corrugated light-guiding structure, the flexible light guide film is able to convert point light sources into a uniform planar light source. Meanwhile, the corrugated structure of the light guide film also enables the direct-type light source module having flexibility.

In the disclosed exemplary embodiment, the flexible light guide film includes, for example, a plurality of hexagon light-guiding portions. The light-guiding portions are periodically arranged, integrated formed and have continuous structure distribution to form a flexible light guide film with honeycomb structure. It should be noted that the geometric shape of the light-guiding portions and the structure of the flexible light guide film are an example for explanation, which the invention is not limited to. The geometric shape of a light-guiding portion can be also, for example, a polygon such as triangle, quadrilateral or pentagon. At the time, the flexible light guide film can also have continuous structure distribution to achieve flexible ductility characteristic, for which the invention is not limited to the corrugated structure. On the other hand, in the disclosed exemplary embodiment, the point light sources are, for example, LEDs, but the invention is not limited to.

Figure 2:
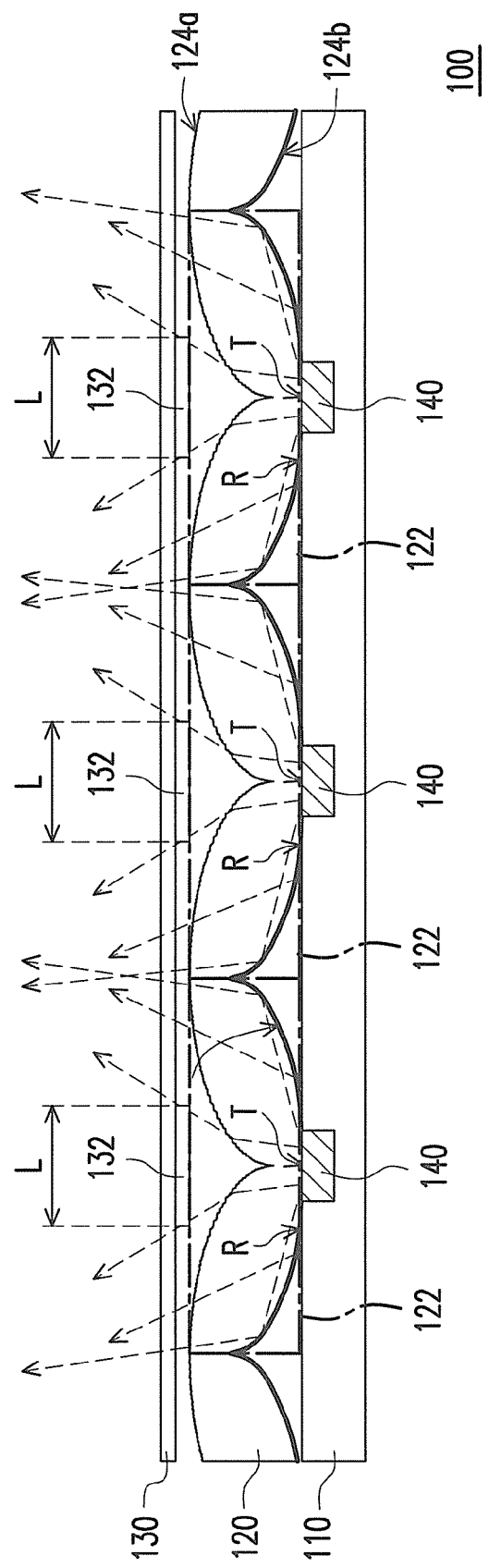
FIG. 2 is a cross-sectional diagram of FIG. 1 along A-A' line.
Figure 3:
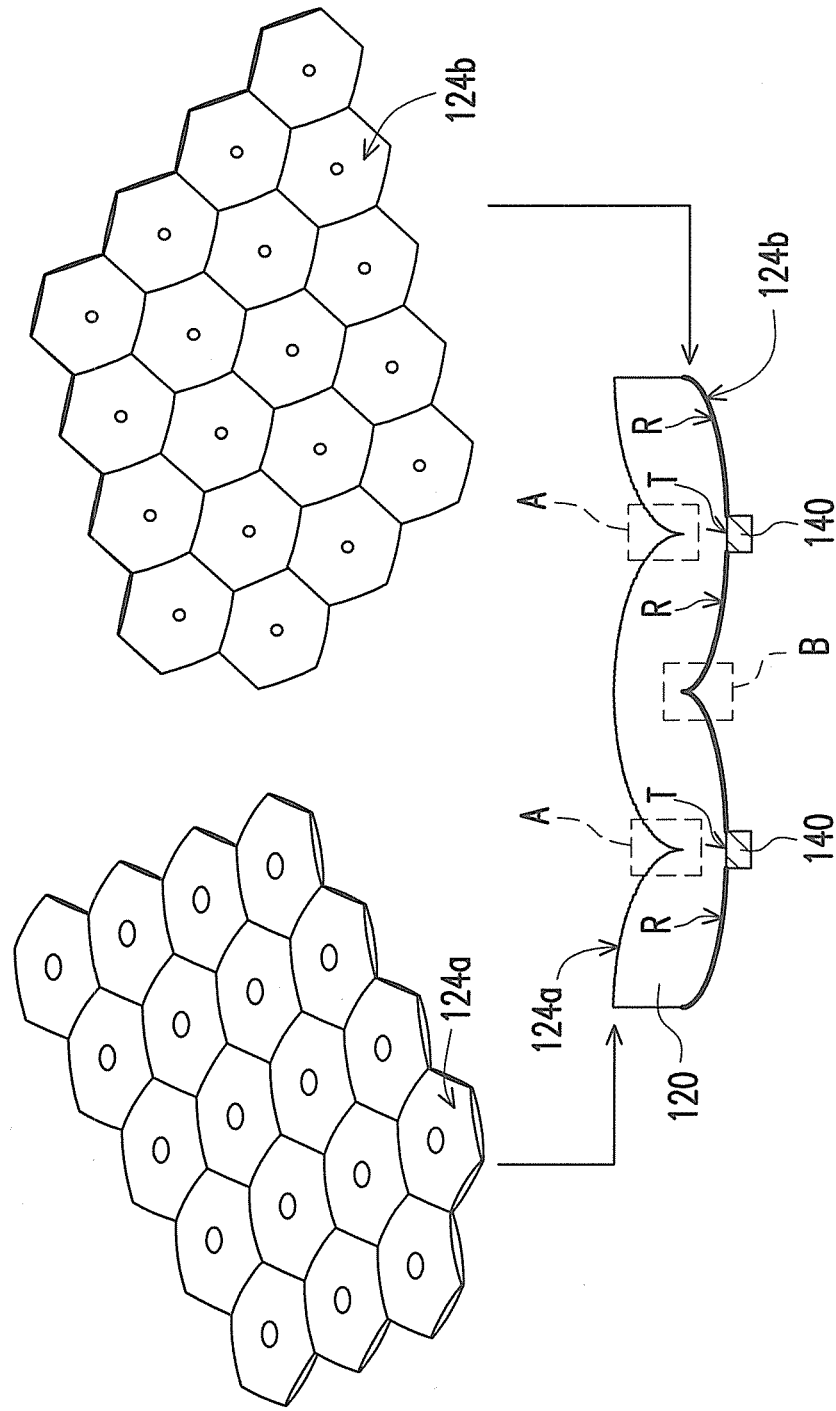
FIG. 3 illustrates a front view diagram of the light emitting surface of the flexible light guide film and a front view diagram of the light incident surface thereof, respectively.

FIG. 1 is a top view diagram of a flexible light source module according to an embodiment, FIG. 2 is a cross-sectional diagram of FIG. 1 along A-A' line and FIG. 3 illustrates a front view diagram of the light emitting surface of the flexible light guide film and a front view diagram of the light incident surface thereof, respectively. Referring to FIGS. 1-3, in the embodiment, a flexible light source module 100 includes a flexible substrate 110, a flexible light guide film 120, a diffusion film 130 and a plurality of point light sources 140. The flexible light guide film 120 is disposed on the point light sources 140 and the point light sources 140 are disposed between the flexible substrate 110 and the flexible light guide film 120. The point light sources 140 herein can be buried in the flexible substrate 110 or fixed on the flexible substrate 110. The diffusion film 130 is disposed on the flexible light guide film 120. The light beams emitted from the point light sources 140 exit out of the flexible light source module 100 via the flexible light guide film 120 so that the flexible light source module 100 provides a uniform planar light source.

In more details, in the embodiment, the flexible light guide film 120 includes a plurality of light-guiding portions 122. Each the light-guiding portion 122 has hexagon geometric shape and has a light emitting surface 124a and a light incident surface 124b. The light-guiding portions are integrated formed and periodically joined together to give out a hexagon honeycomb arrangement, which makes the flexible light source module 100 achieve the effect of a planar light source. The interval of the geometric centers of every two adjacent light-guiding portions 122 is P and the intervals are substantially equal to each other, wherein P ranges between 5 mm and 40 mm. It should be noted that the so-called "corrugated" design at least means the light emitting surfaces and the light incident surfaces of the flexible light guide film 120 respectively have bendable recesses in A region and recesses in B region by design, as shown in FIG. 3. The recesses not only have required arc surfaces to reflect light, but also have flexible ductility characteristic.

As a result, the corrugated light-guiding structure of the flexible light guide film 120 is formed by two up-and-down arc surfaces with alternate arrangement, i.e., a light emitting surface 124a and a light incident surface 124b. The light emitting surface 124a is a coarse surface so as to enable the light beams emitted from the point light sources 140 uniformly diffused, wherein the surface haze of the coarse surface ranges between 10% and 90% and the transmittance thereof ranges between 60% and 99%. The light incident surface 124b includes an incident region T and a reflective region R. The light beams emitted from the point light sources 140 are respectively incident upon each of the light-guiding portions 122 via the incident regions T. After that, the light beams are transmitted towards the direction of the light emitting surfaces 124a via the reflective regions R. In the embodiment, the reflectance of the reflective region R ranges between 90% and 99.99%. In other words, the light incident surfaces 124b have reflectivity and reflect the light beams come from the point light sources 140 and incident upon the light-guiding portions 122 so that the light beams exit towards the normal direction.

On the other hand, in the embodiment, the point light sources 140 are, for example, LED point light sources arranged in an array. The LEDs in an array are arranged, for example, correspondingly to the geometric centers of the light-guiding portions one for one, so that the light beams emitted from the point light sources 140 are incident upon the corresponding light-guiding portions 122 via the incident regions T of the light incident surfaces 124b.

In order to avoid the excessively strong emitting light over the LED point light sources, the diffusion film 130 of the embodiment includes a plurality of round mesh point diffusion films. The mesh points 132 are disposed one for one over the corresponding point light sources so as to solve the problem of the excessively strong emitting light. In the embodiment, the radius of the round mesh points ranges, for example, between 1 mm and 10 mm and the surface haze of the mesh points ranges between 30% and 80%. In other words, L shown in FIGS. 1 and 2 is the diameter of a round mesh point and ranges between 2 mm and 20 mm. Hence in the embodiment, the round mesh point diffusion films with diameter L are disposed outside the flexible light guide film 120 and located over the corresponding point light sources 140, wherein the position period thereof is corresponding to the arrangement period of the point light sources 140 and the light-guiding portions 122.

Figure 4:
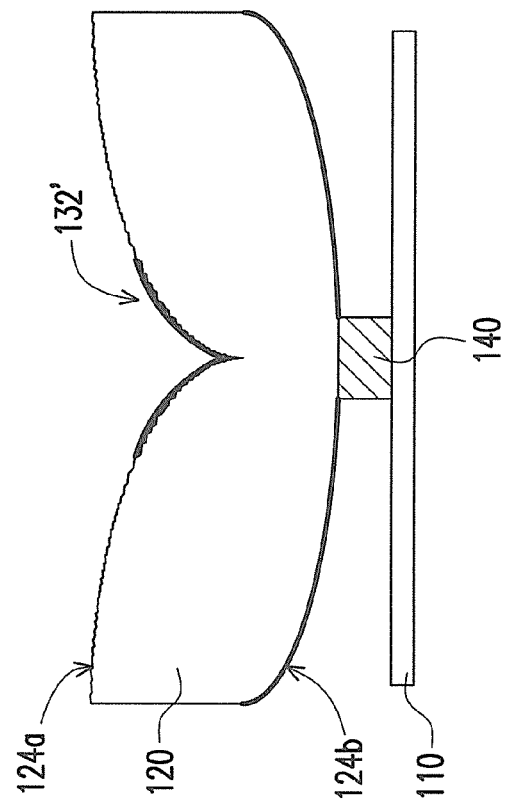
FIG. 4 is a diagram showing a diffusion material is spread on the flexible light guide film according to an embodiment.

In the embodiment, the flexible light source module 100 includes a diffusion film 130, which the invention is not limited to. FIG. 4 is a diagram showing a diffusion material 132' is spread on the flexible light guide film 120 according to an embodiment. With spreading and adhering way, the diffusion material 132' overlays a local region of the light emitting surface 124a, which is also a solution to overcome the problem of the excessively strong emitting light at the centers of the point light sources 140, as shown by FIG. 4.

Figure 5:
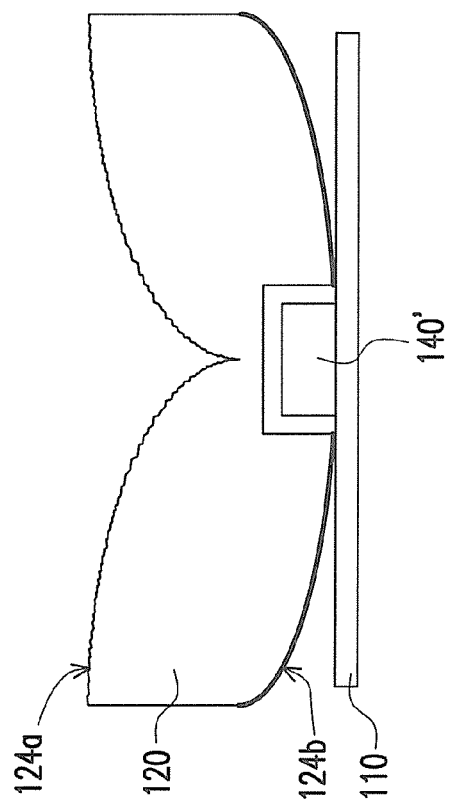
FIG. 5 is a diagram showing a point light source is an SMD LED.

In the embodiment, the point light sources 140 are not embedded in the flexible light guide film 120, which the invention is not limited to. FIG. 5 is a diagram showing that a point light source 140' is a surface mount die light-emitting diode (SMD LED), wherein the LED is embedded in the flexible light guide film 120. In the embodiment, the packages of the SMD LEDs are, for example, soldered on the flexible substrate 110, while the flexible light guide film 120 is cut to form recesses so as to accommodate the packages of the SMD LEDs. In this way, the packages of the SMD LEDs are embedded in the flexible light guide film 120, as shown by FIG. 5.

On the other hand, in the embodiment, the material of the light-guiding portions 122 and the diffusion film 130 includes at least one of silicon, polypropylene (PP), polymethyl methacrylate (PMMA), polyimide (PI), polyethylene terephthalate (PET), polyethylene naphthalate (PEN) or polydimethylsiloxane (PDMS).

Figure 6A:
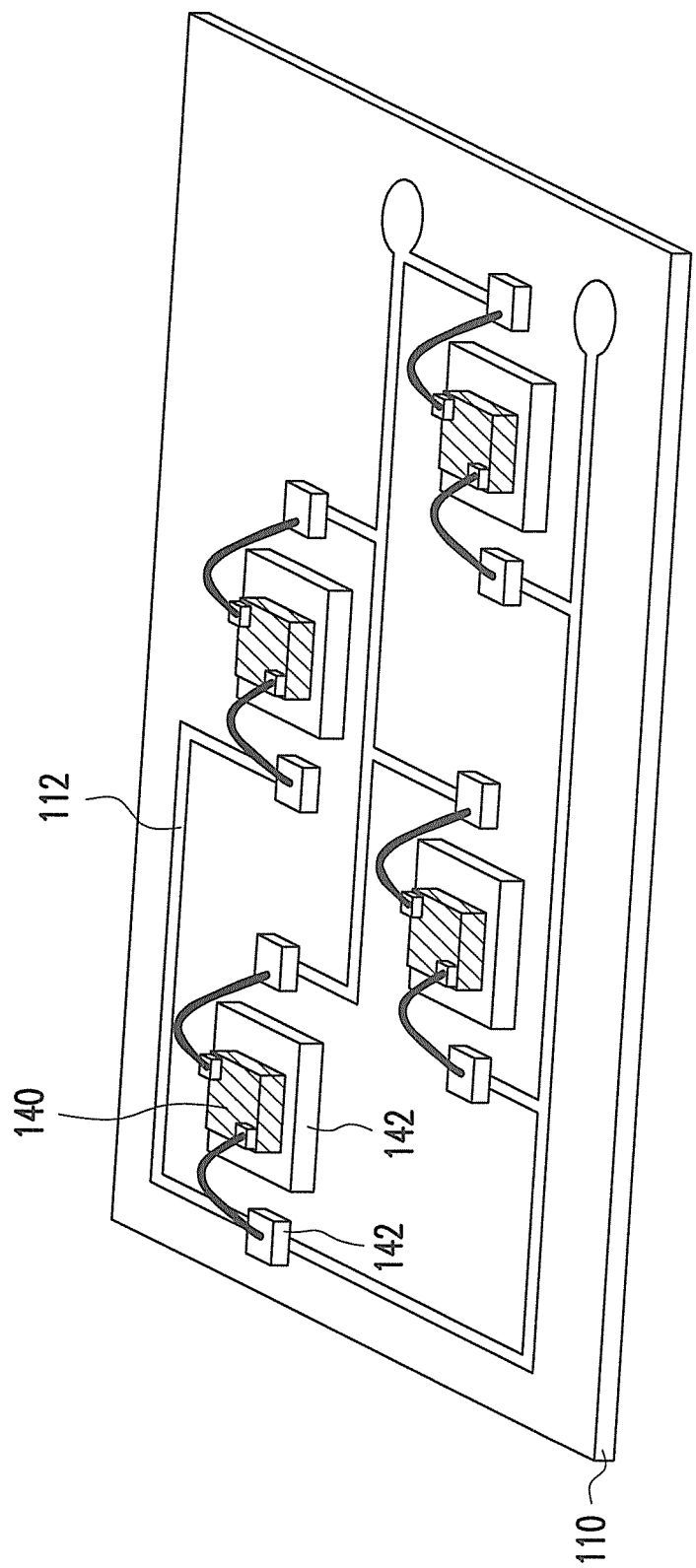
FIG. 6A illustrates a plurality of point light sources are electrically connected to a flexible substrate through a patterned metallic conductive circuit and a plurality of metallic pads.
Figure 6B:
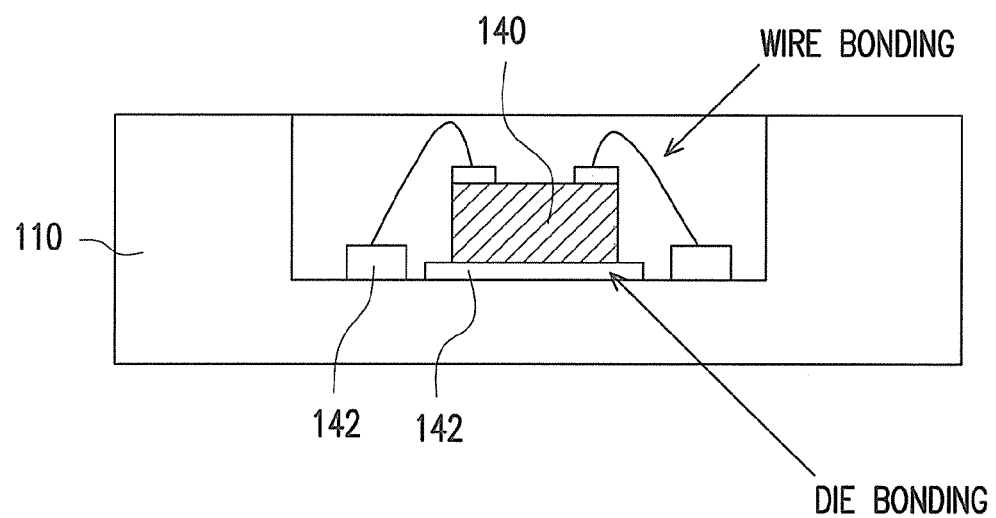
FIG. 6B illustrates an electrical connection way between a point light source, a metallic conductive circuit and two metallic pads according to an embodiment.
Figure 6C:
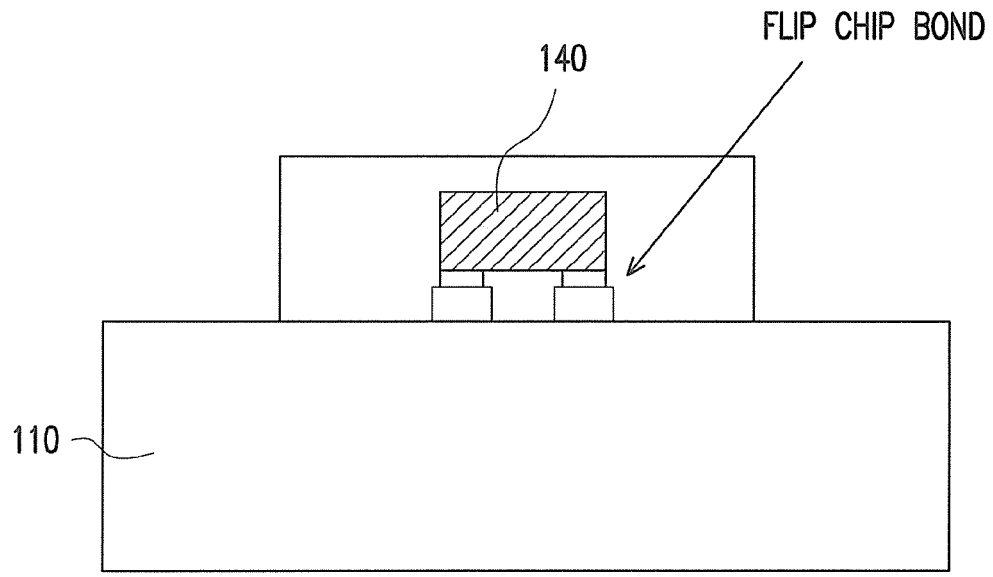
FIG. 6C illustrates an electrical connection way between a point light source, a metallic conductive circuit and two metallic pads according to another embodiment.

FIG. 6A illustrates a plurality of point light sources of the embodiment are electrically connected to a flexible substrate through a patterned metallic conductive circuit and a plurality of metallic pads, FIG. 6B illustrates an electrical connection way between a point light source, a metallic conductive circuit and two metallic pads according to an embodiment, wherein the connection way includes wire bonding and die bonding. FIG. 6C illustrates an electrical connection way between a point light source, a metallic conductive circuit and two metallic pads according to another embodiment, wherein the connection way includes flip chip bond. In the embodiment, the flexible substrate 110 includes a patterned metallic conductive circuit 112 and a plurality of metallic pads 142, as shown by FIG. 6A. In FIG. 6A, the point light sources 140 of the embodiment are electrically connected to the flexible substrate 110 through the patterned metallic conductive circuit 112 and the metallic pads 142. The electrical connection way between the point light sources 140 and the metallic conductive circuit 112 and metallic pads 142 can be die bonding with encapsulant, wire bonding, die bond, eutectic die bonding, flip chip bond or chip in substrate package for being bonded on the metallic pads 142. FIG. 6B illustrates the chip in substrate package technology, wherein the electrical connection way between the point light sources, the metallic conductive circuit and the metallic pads includes wire bonding and die bond. In FIG. 6C, the electrical connection way includes flip chip bond. The material of the flexible substrate 110 in the embodiment includes, for example, copper, aluminium, gold or an alloy of any combination thereof. In other embodiments, the material of the flexible substrate further includes, for example, plastic material such as polyimide (PI). In the disclosed exemplary embodiments, the flexible light guide film takes a light-guiding portion as a unit cell and is integrated formed with continuously distributed periodic structures. Each of the light emitting surfaces and each of the light incident surfaces of the flexible light guide film are respectively, for example, an aspheric design with over two arc surfaces joined by each other, which the invention is not limited to.

Figure 7:
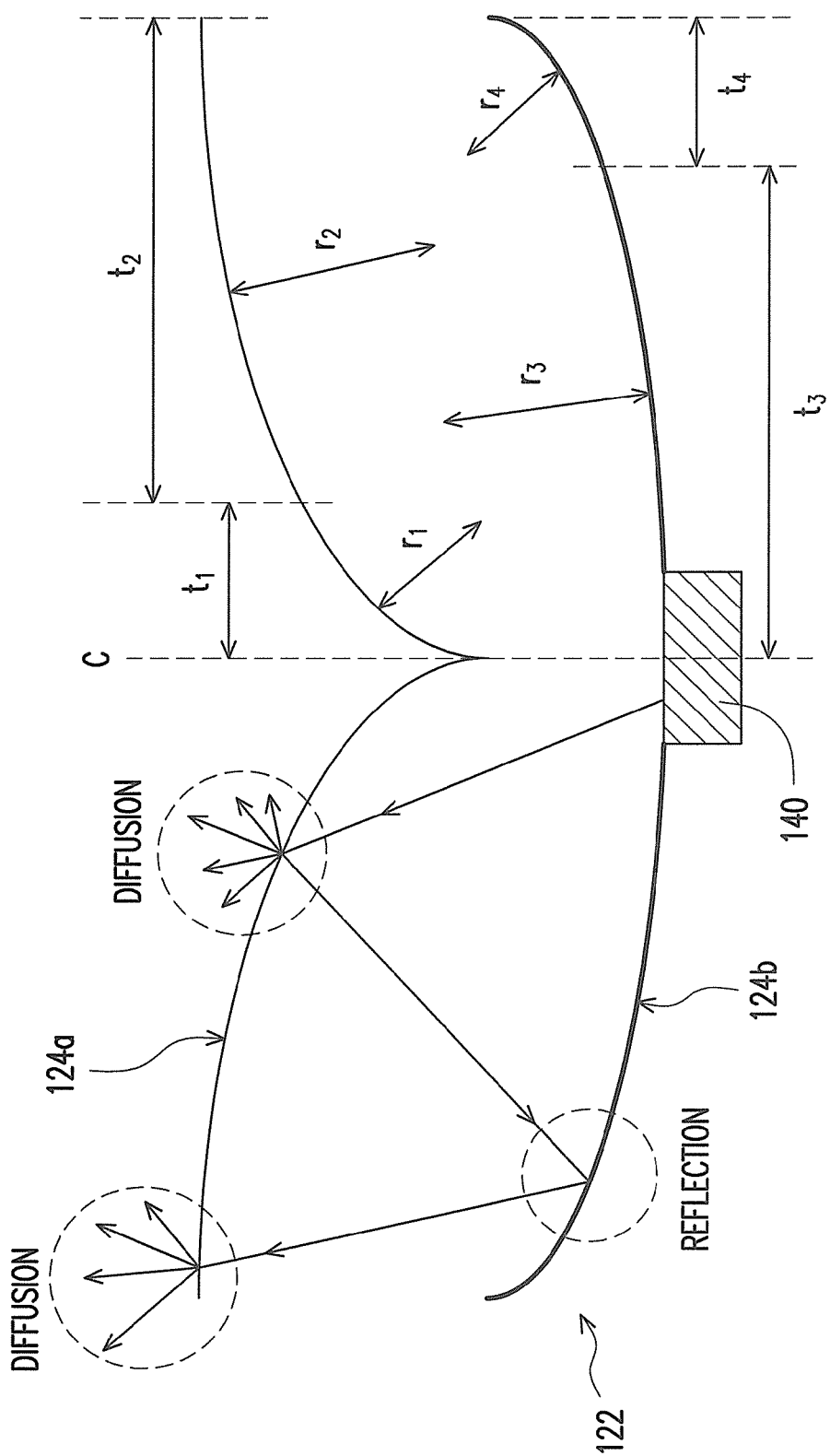
FIG. 7 is a diagram of the flexible light guide film structure of a light-guiding portion in FIG. 1.

In more details, FIG. 7 can be referred to. FIG. 7 is a diagram of the flexible light guide film structure of a light-guiding portion in FIG. 1. In the embodiment, the light-guiding portion 122 includes a light incident surface 124b and a light emitting surface 124a, wherein the light incident surface 124b includes a plurality of light incident sub-surfaces and the light emitting surface 124a includes a plurality of light emitting sub-surfaces.

The light incident surface 124b of the embodiment includes a first light incident sub-surface and a second light incident sub-surface. The first light incident sub-surface herein is, for example, the portion of the light incident surface 124b within the scope of the segment $t_3$ and the second light incident sub-surface is, for example, the portion of the light incident surface 124b within the scope of the segment $t_4$. That is to say, among the light incident sub-surfaces, the one closest to the geometric center C of the light-guiding portion is the first light incident sub-surface. In the embodiment, the absolute values of the tangent slopes of the first light incident sub-surface are descended with approaching the geometric center C of the light-guiding portion. The absolute values of the tangent slopes of the second light incident sub-surface are descended with approaching the geometric center C of the light-guiding portion. The average curvature radius $r_3$ of the first light incident sub-surface is greater than the average curvature radius $r_4$ of the second light incident sub-surface.

In addition, if a good optical coupling interface between the point light source 140 and the corresponding light-guiding portion 122 is wished, the tangent slopes of the first light incident sub-surface close to the geometric center C can be zero by design and the average curvature radius $r_3$ approaches infinity. At the time, the optical coupling interface between the first light incident sub-surface and the point light source 140 is a plane, which can advance the optical coupling proportion of the light beam over the light-guiding portion.

To be specific, if it is viewed from the top view angle of the light-guiding portion 122, a circle range with the geometric center C of the light-guiding portion as the circle center and the segment $t_3$ as the radius can be made. The portion of the light incident surface within the circle range belongs to the first light incident sub-surface of the light-guiding portion 122. Similarly, a ring range with the geometric center C of the light-guiding portion as the circle center and the segments $t_3+t_4$ and $t_3$ as the two radiuses can be made. The portion of the light incident surface within the ring range belongs to the second light incident sub-surface of the light-guiding portion 122.

On the other hand, the light emitting surface 124a of the embodiment is disposed oppositely to the light incident surface. The first light emitting sub-surface herein is, for example, the portion of the light emitting surface 124a within the scope of the segment $t_1$ and the second light emitting sub-surface is, for example, the portion of the light emitting surface 124a within the scope of the segment $t_2$. That is to say, among the light emitting sub-surfaces, the one closest to the geometric center C of the light-guiding portion is the first light emitting sub-surface. In the embodiment, the absolute values of the tangent slopes of the first light emitting sub-surface are ascending with approaching the geometric center C of the light-guiding portion. The absolute values of the tangent slopes of the second light emitting sub-surface are ascending with approaching the geometric center C of the light-guiding portion. The average curvature radius $r_1$ of the first light emitting sub-surface is less than the average curvature radius $r_2$ of the second light emitting sub-surface.

To be specific, if it is viewed from the top view angle of the light-guiding portion 122, a circle range with the geometric center C of the light-guiding portion as the circle center and the segment $t_1$ as the radius can be made. The portion of the light emitting surface within the circle range belongs to the first light emitting sub-surface of the light-guiding portion 122. Similarly, a ring range with the geometric center C of the light-guiding portion as the circle center and the segments $t_1+t_2$ and $t_1$ as the two radiuses can be made. The portion of the light emitting surface within the ring range belongs to the second light emitting sub-surface of the light-guiding portion 122.

In the embodiment, according to the depiction above, the light emitting surface 124a is an aspheric design with over two arc surfaces joined by each other. Taking an aspheric design with two arc surfaces joined by each other as an example, the design specifies the curvature variations of the first and second light emitting sub-surfaces respectively within the segment $t_1$ and the segment $t_2$. Similarly, the light incident surface 124b is an aspheric design with over two arc surfaces joined by each other. Taking an aspheric design with two arc surfaces joined by each other as an example, the design specifies the curvature variations of the first and second light incident sub-surfaces respectively within the segment $t_3$ and the segment $t_4$. As a result, when the light beams provided by the point light sources 140 enter the light-guiding structure, the partial light exiting from the front is reflected back into the light guide film by means of the curvature variations of the first and second light emitting sub-surfaces. When the light arrives at the reflective regions of the first and second light incident sub-surfaces, the reflected light exits towards the front, wherein the coarse design of the light emitting surfaces makes the light diffused to achieve the uniformity effect.

Figure 8:
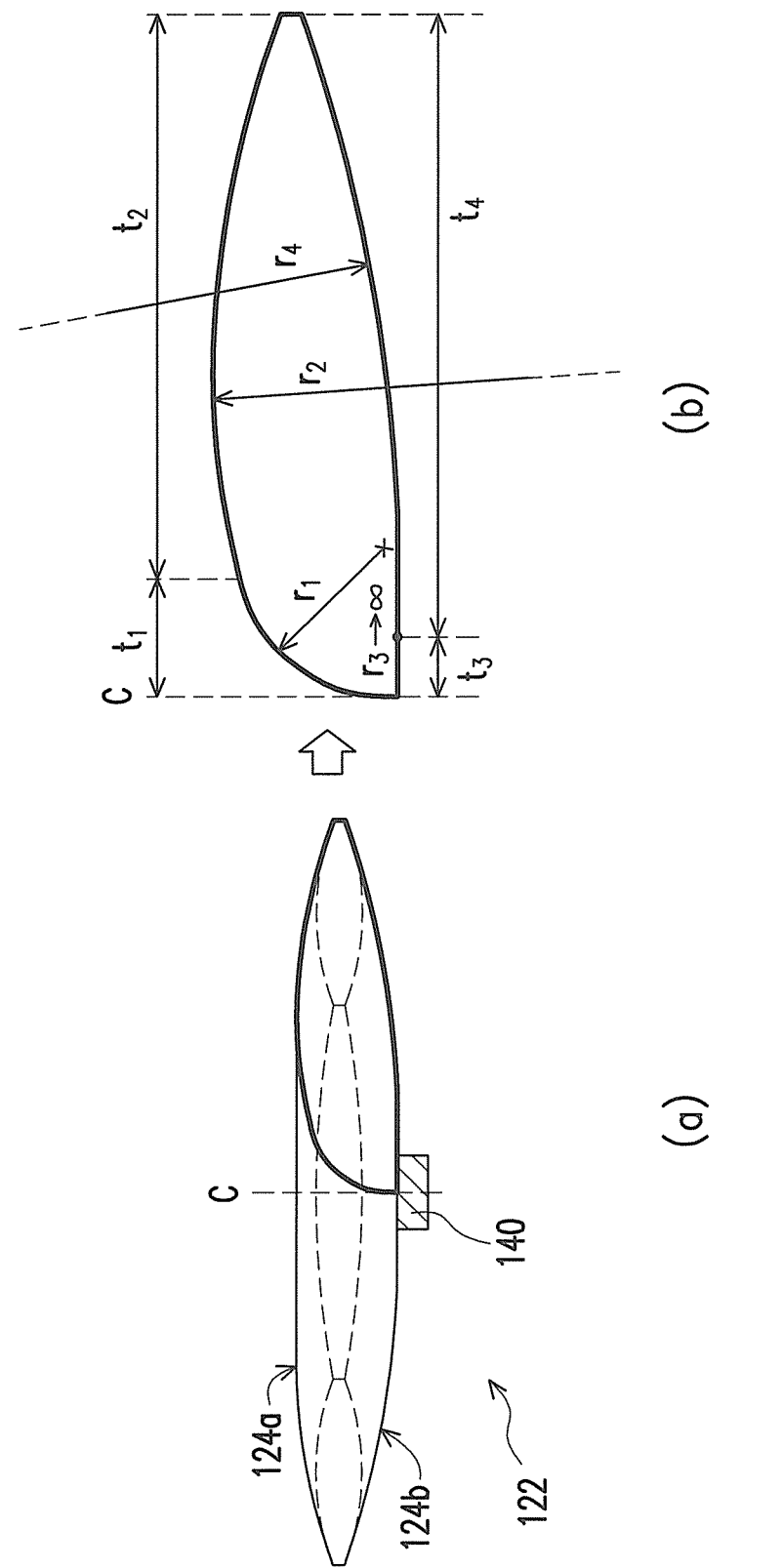
FIG. 8 is a diagram of the flexible light guide film structure of a light-guiding portion according to another embodiment.

FIG. 8 is a diagram of the flexible light guide film structure of a light-guiding portion according to another embodiment. Referring to FIGS. 8(a) and 8(b), in the embodiment, the first light incident sub-surface is, for example, the portion of the light incident surface 124b within the scope of the segment $t_3$ and the second light incident sub-surface is, for example, the portion of the light incident surface 124b within the scope of the segment $t_4$. In the embodiment, the absolute values of the tangent slopes of the first light incident sub-surface are zero and the average curvature radius $r_3$ approaches infinity, i.e., the first light incident sub-surface in the embodiment is a plane so as to advance the optical coupling proportion of the light source over the light-guiding portion. The absolute values of the tangent slopes of the second light incident sub-surface are descended with approaching the geometric center C of the light-guiding portion, wherein the average curvature radius $r_3$ of the first light incident sub-surface is greater than the average curvature radius $r_4$ of the second light incident sub-surface.

If it is viewed from the top view angle of the light-guiding portion 122, a circle range with the geometric center C of the light-guiding portion as the circle center and the segment $t_3$ as the radius can be made. The portion of the light incident surface within the circle range belongs to the first light incident sub-surface of the light-guiding portion 122. Similarly, a ring range with the geometric center C of the light-guiding portion as the circle center and the segments $t_3+t_4$ and $t_3$ as the two radiuses can be made. The portion of the light incident surface within the ring range belongs to the second light incident sub-surface of the light-guiding portion 122.

On the other hand, the light emitting surface 124a of the embodiment is disposed oppositely to the light incident surface. The first light emitting sub-surface herein is, for example, the portion of the light emitting surface 124a within the scope of the segment $t_1$ and the second light emitting sub-surface is, for example, the portion of the light emitting surface 124a within the scope of the segment $t_2$. That is to say, among the light emitting sub-surfaces, the one closest to the geometric center C of the light-guiding portion is the first light emitting sub-surface. In the embodiment, the absolute values of the tangent slopes of the first light emitting sub-surface are ascending with approaching the geometric center C of the light-guiding portion. The absolute values of the tangent slopes of the second light emitting sub-surface are firstly descended and then ascending with approaching the geometric center C of the light-guiding portion. The average curvature radius $r_1$ of the first light emitting sub-surface is less than the average curvature radius $r_2$ of the second light emitting sub-surface.

If it is viewed from the top view angle of the light-guiding portion 122, a circle range with the geometric center C of the light-guiding portion as the circle center and the segment $t_1$ as the radius can be made. The portion of the light emitting surface within the circle range belongs to the first light emitting sub-surface of the light-guiding portion 122. Similarly, a ring range with the geometric center C of the light-guiding portion as the circle center and the segments $t_1+t_2$ and $t_1$ as the two radiuses can be made. The portion of the light emitting surface within the ring range belongs to the second light emitting sub-surface of the light-guiding portion 122.

In the embodiment, the segments and the average curvature radiuses of the light emitting surface and the light incident surface can be adjusted in a specific range according to the real application. For example, the segments can be $t_1=0.5$-8 mm, $t_2=5$-22 mm, $t_3=0.5$-8 mm, $t_4=7$-22 mm and the average curvature radiuses can be $r_1=1$-5 mm, $r_2=10$-30 mm, $r_1\to\infty$, $r_4=20$-200 mm.

It should be noted that, in the disclosed embodiments, all the numerical ranges of each parameter, for example, surface haze, transmittance, reflectance, glossiness, interval P of adjacent geometric centers, diameter L of a round mesh point, segment length and average curvature radius, include the values of the two ends of individual numerical range.

In summary, in the disclosed embodiments, the flexible light source module can convert the point light sources into a uniform planar light source by means of corrugated light guide film. Meanwhile, the corrugated structure of the light guide film makes the light source module flexible.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:

1. A flexible light source module, comprising:
   a flexible substrate;
   a flexible light guide film disposed on a plurality of point light sources and comprising a plurality of light-guiding portions, wherein each of the light-guiding portions comprises:
      a light incident surface comprising a plurality of light incident sub-surfaces, wherein among the light incident sub-surfaces, the one closest to the geometric center of the light-guiding portion is a first light incident sub-surface; and
      a light emitting surface opposite to the light incident surface and comprising a plurality of light emitting sub-surfaces, wherein among the light emitting sub-surfaces, the one closest to the geometric center of the light-guiding portion is a first light emitting sub-surface, and the absolute values of the tangent slopes of the first light emitting sub-surface are ascending with approaching the geometric center; and
   the point light sources disposed at the flexible substrate, wherein light beams emitted from the point light sources exit out of the flexible light source module via the flexible light guide film, wherein the light incident surface comprises the first light incident sub-surface and a second light incident sub-surface, and the average curvature radius of the first light incident sub-surface is greater than the average curvature radius of the second light incident sub-surface.

2. The flexible light source module as claimed in claim 1, wherein the light emitting surface comprises the first light emitting sub-surface and a second light emitting sub-surface, and the average curvature radius of the first light emitting sub-surface is less than the average curvature radius of the second light emitting sub-surface.

3. The flexible light source module as claimed in claim 2, wherein the absolute values of the tangent slopes of the second light emitting sub-surface are ascending with approaching the geometric center.

4. The flexible light source module as claimed in claim 2, wherein the absolute values of the tangent slopes of the second light emitting sub-surface are firstly descended and then ascending with approaching the geometric center.

5. The flexible light source module as claimed in claim 1, wherein the light emitting surface is a coarse surface.

6. The flexible light source module as claimed in claim 5, wherein the surface haze of the coarse surface ranges between 10% and 90%, and the transmittance thereof ranges between 60% and 99%.

7. The flexible light source module as claimed in claim 1, wherein the absolute values of the tangent slopes of the first light incident sub-surface are descended with approaching the geometric center.

8. The flexible light source module as claimed in claim 1, wherein the absolute values of the tangent slopes of the second light incident sub-surface are descended with approaching the geometric center.

9. The flexible light source module as claimed in claim 1, wherein the first light incident sub-surface is a plane.

10. The flexible light source module as claimed in claim 1, wherein the light incident surface comprises an incident region, and the light beams emitted from the point light sources are incident upon the light-guiding portions via the incident regions.

11. The flexible light source module as claimed in claim 10, wherein the light incident surface further comprises a reflective region, and the light beams come from the point light sources and incident upon the light-guiding portions are transmitted towards the directions of the light emitting surfaces via the reflective regions.

12. The flexible light source module as claimed in claim 11, wherein the reflectance of the reflective region ranges between 90% and 99.99%.

13. The flexible light source module as claimed in claim 1, wherein the geometric shape of the light-guiding portions is polygon, and the flexible light guide film is integrated formed by joining the light-guiding portions together.

14. The flexible light source module as claimed in claim 1, wherein the geometric shape of the light-guiding portions is hexagon, and the flexible light guide film is integrated formed by joining the light-guiding portions together as a honeycomb structure.

15. The flexible light source module as claimed in claim 1, wherein the light-guiding portions are periodically arranged, the interval of the adjacent geometric centers thereof is P, and P is substantially equal to each other and ranges between 5 mm and 40 mm.

16. The flexible light source module as claimed in claim 1, wherein the material of the light-guiding portions comprises at least one of silicon, polypropylene (PP), polymethyl methacrylate (PMMA), polyimide (PI), polyethylene terephthalate (PET), polyethylene naphthalate (PEN) or polydimethylsiloxane (PDMS).

17. The flexible light source module as claimed in claim 1, wherein the point light sources are disposed correspondingly to the geometric centers of the light-guiding portions one for one.

18. The flexible light source module as claimed in claim 1, wherein the point light sources are light-emitting diode light sources.

19. The flexible light source module as claimed in claim 1, further comprising a diffusion film disposed on the flexible light guide film.

20. The flexible light source module as claimed in claim 19, wherein the diffusion film comprises a plurality of mesh points, and the mesh points are disposed over the point light sources one for one.

21. The flexible light source module as claimed in claim 19, wherein the mesh points are round and the radius thereof ranges between 1 mm and 10 mm.

22. The flexible light source module as claimed in claim 19, wherein the surface haze of the mesh points ranges between 30% and 80%.

23. The flexible light source module as claimed in claim 19, wherein the material of the diffusion film comprises at least one of silicon, polypropylene (PP), polymethyl methacrylate (PMMA), polyimide (PI), polyethylene terephthalate (PET), polyethylene naphthalate (PEN) or polydimethylsiloxane (PDMS).

24. The flexible light source module as claimed in claim 1, wherein the material of the flexible substrate comprises copper, aluminium, gold or an alloy of any combination thereof.

25. The flexible light source module as claimed in claim 1, wherein the material of the flexible substrate comprises polyimide (PI).

26. The flexible light source module as claimed in claim 1, wherein the flexible substrate comprises a patterned metallic conductive circuit and a plurality of metallic pads, and the point light sources are electrically connected to the flexible substrate through the patterned metallic conductive circuit and the metallic pads.

27. The flexible light source module as claimed in claim 1, wherein the flexible light guide film has corrugated shape, and the corrugated flexible light guide film comprises a plurality of bendable recesses.

28. The flexible light source module as claimed in claim 1, further comprising a diffusion material spread on the flexible light guide film.

29. The flexible light source module as claimed in claim 1, wherein the point light sources are electrically connected to the flexible substrate by wire bonding and die bond or by flip chip bond.

* * * * *